(12) United States Patent
Jeon et al.

(10) Patent No.: US 10,203,576 B2
(45) Date of Patent: Feb. 12, 2019

(54) DISPLAY SUBSTRATE WITH A COMMON ELECTRODE AND LIQUID CRYSTAL DISPLAY PANEL HAVING THE SAME

(71) Applicant: SAMSUNG DISPLAY CO., LTD., Yongin-si, Gyeonggi-do (KR)

(72) Inventors: Yong-Je Jeon, Yongin-si (KR); Jin-Suk Park, Yongin-si (KR); Seok-Je Seong, Yongin-si (KR); Sang-Woo Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 15/332,289

(22) Filed: Oct. 24, 2016

(65) Prior Publication Data

US 2017/0038657 A1    Feb. 9, 2017

Related U.S. Application Data

(62) Division of application No. 13/923,314, filed on Jun. 20, 2013, now Pat. No. 9,496,286.

(30) Foreign Application Priority Data

Oct. 5, 2012  (KR) .................. 10-2012-0110417

(51) Int. Cl.
*G02F 1/1362* (2006.01)
*G02F 1/1337* (2006.01)
(Continued)

(52) U.S. Cl.
CPC ...... *G02F 1/136286* (2013.01); *G02F 1/1368* (2013.01); *G02F 1/133707* (2013.01);
(Continued)

(58) Field of Classification Search
CPC combination set(s) only.
See application file for complete search history.

(56) References Cited

U.S. PATENT DOCUMENTS 7,859,630 B2    12/2010  Wakabayashi
7,973,754 B2    7/2011   Kim
(Continued)

FOREIGN PATENT DOCUMENTS

CN    101097372 A    1/2008
CN    102078181 A    5/2011
(Continued)

OTHER PUBLICATIONS

EPO Search Report dated Dec. 17, 2013, for corresponding European Patent application 13185332.7, (3 pages).
(Continued)

*Primary Examiner* — Lauren Nguyen
(74) *Attorney, Agent, or Firm* — Lewis Roca Rothgerber Christie LLP

(57) ABSTRACT

A display substrate includes a display area corresponding to a plurality of pixels, a peripheral area surrounding the display area, a thin film transistor for driving a corresponding one of the pixels, a gate line electrically coupled to the thin film transistor, a data line crossing the gate line and electrically coupled to the thin film transistor, a pixel electrode electrically coupled to the thin film transistor, and a common electrode overlapping the pixel electrode and having a first opening overlapping a first pixel of the pixels, and a second opening overlapping a second pixel of the pixels adjacent the first pixel, wherein the first opening and the second opening extend in different directions, and wherein the common electrode is continuous and overlaps the first and second pixels.

20 Claims, 15 Drawing Sheets

(51) Int. Cl.
 *G02F 1/1368* (2006.01)
 *G02F 1/1343* (2006.01)
 *H01L 27/12* (2006.01)

(52) U.S. Cl.
 CPC .. *G02F 1/133784* (2013.01); *G02F 1/134363* (2013.01); *G02F 1/136209* (2013.01); *G02F 1/136227* (2013.01); *H01L 27/124* (2013.01); *G02F 2001/13685* (2013.01); *G02F 2001/134318* (2013.01); *G02F 2001/134372* (2013.01)

(56) References Cited

U.S. PATENT DOCUMENTS

| | | | |
|---|---|---|---|
| 8,698,158 | B2 | 4/2014 | Hur et al. |
| 2006/0290869 | A1 | 12/2006 | Suzuki |
| 2009/0009671 | A1 | 1/2009 | Wakabayashi |
| 2009/0128727 | A1 | 5/2009 | Yata |
| 2009/0244468 | A1 | 10/2009 | Taniguchi et al. |
| 2010/0207862 | A1 | 8/2010 | Xu et al. |
| 2011/0216280 | A1* | 9/2011 | Itou .................. G02F 1/134363 349/143 |

FOREIGN PATENT DOCUMENTS

| | | |
|---|---|---|
| JP | 2008-276172 A | 11/2008 |
| JP | 2010-102284 A | 5/2010 |
| KR | 10-2007-0020868 | 2/2007 |
| KR | 10-2011-0115155 | 10/2011 |
| KR | 10-2012-0025887 | 3/2012 |
| KR | 10-1130526 | 3/2012 |

OTHER PUBLICATIONS

Korean Patent Abstracts, Publication No. KR 1020090052808 A dated May 26, 2009 corresponding to Korean Patent No. KR-10-1130526, 3 pages.

* cited by examiner

DISPLAY SUBSTRATE WITH A COMMON ELECTRODE AND LIQUID CRYSTAL DISPLAY PANEL HAVING THE SAME

CROSS REFERENCE TO RELATED APPLICATION

This application is a divisional of U.S. patent application Ser. No. 13/923,314, filed on Jun. 20, 2013, which claims priority to and the benefit of Korean patent Application No. 10-2012-0110417 filed on Oct. 5, 2012, the disclosures of both of which are hereby incorporated by reference herein in their entirety.

BACKGROUND

1. Technical Field

Example embodiments of the present invention relate to a display substrate and a liquid crystal display panel having the display substrate.

2. Description of the Related Art

Liquid crystal display devices have various advantages, such as light weight, thinness, low power consumption, etc., making liquid crystal display devices widely used.

The liquid crystal display device controls alignment of liquid crystal using an electric field formed between two electrodes, such as a pixel electrode and a common electrode, to display an image. The pixel electrode and the common electrodes may be formed at different substrates. However, use of a plane line switching, or plane to line switching, liquid crystal panel (e.g., a PLS type LCD) including a pixel electrode and a common electrode, which are formed at a same substrate, is recently increasing to improve a view angle, etc.

However, colors represented by the PLS type liquid crystal panel may vary depending on a viewing angle. When a plurality of domains is formed in a pixel to improve the color variation problem, a liquid crystal texture may be formed adjacent a domain boundary, thereby decreasing brightness.

SUMMARY

Example embodiments of the present invention provide a display substrate and a LCD panel capable of improving display quality without decreasing brightness.

According to one aspect of example embodiments of the present invention, a display substrate includes a display area corresponding to a plurality of pixels, a peripheral area surrounding the display area, a thin film transistor for driving a corresponding one of the pixels, a gate line electrically coupled to the thin film transistor, a data line crossing the gate line and electrically coupled to the thin film transistor, a pixel electrode electrically coupled to the thin film transistor, and a common electrode overlapping the pixel electrode and having a first opening overlapping a first pixel of the pixels, and a second opening overlapping a second pixel of the pixels adjacent the first pixel, wherein the first opening and the second opening extend in different directions, and wherein the common electrode is continuous and overlaps the first and second pixels.

The first opening and the second opening may collectively form a continuous opening.

The first pixel may be adjacent the second pixel in a row direction.

The first opening may be symmetrical to the second opening with respect to the data line.

The common electrode may further have a third opening overlapping a third pixel of the pixels that is adjacent the first pixel in a column direction, and a fourth opening overlapping a fourth pixel of the pixels that is adjacent the second pixel in the column direction and is adjacent the third pixel in the row direction, and the third opening may be symmetrical to the first opening with respect to the gate line, and the fourth opening may be symmetrical to the second opening with respect to the gate line.

The first opening may have a first extending portion extending in a first direction, a second extending portion extending from an end of the first extending portion in a second direction different from the first direction, and a third extending portion extending from an opposite end of the first extending portion in a third direction different from the first direction.

The second direction may be opposite to the third direction.

The second extending portion and the third extending portion may each partially overlap the pixel electrode.

The first pixel may be adjacent the second pixel in a row direction, and may be spaced apart from the second pixel.

The first opening may have a first extending portion extending in a first direction, a second extending portion extending from an end of the first extending portion in a second direction different from the first direction, and a third extending portion extending from an opposite end of the first extending portion in a third direction different from the first direction.

The second extending portion and the third extending portion may respectively overlap an adjacent data line.

The second extending portion and the third extending portion may be spaced from an adjacent data line in a plan view.

The display substrate may further include a common line electrically coupled to the common electrode at the peripheral area.

The common electrode may be on the pixel electrode.

The display substrate may further include a lower alignment layer on the common electrode and rubbed in a row direction.

According to one aspect of example embodiments of the present invention, a display substrate includes a display area corresponding to a plurality of pixels, a peripheral area surrounding the display area, a thin film transistor for driving a corresponding one of the pixels, a gate line electrically coupled to the thin film transistor, a data line crossing the gate line and electrically coupled to the thin film transistor, a pixel electrode electrically coupled to the thin film transistor, and a common electrode overlapping the pixel electrode and having an opening overlapping a first pixel of the pixels, and a second pixel of the pixels adjacent the first pixel, wherein the opening has a zigzag shape.

A protrusion portion of the opening may extend in a column direction and may have a "V" shape.

The opening may have a protrusion portion that overlaps the date line.

The opening of the common electrode may further have a third opening overlapping a third pixel of the pixels adjacent the first pixel in a column direction, and a fourth opening overlapping a fourth pixel of the pixels adjacent the second pixel in the column direction, and the third and fourth openings may be respectively symemetrical to the first and second openings with respect to the gate line.

According to one aspect of example embodiments of the present invention, a liquid crystal display panel includes a display substrate including a display area corresponding to a plurality of pixels, and a peripheral area surrounding the display area, an opposing substrate coupled to the display substrate, a liquid crystal layer between the display substrate and the opposing substrate, a thin film transistor on the display substrate and for driving a corresponding one of the pixels, a gate line electrically coupled to the thin film transistor, a data line crossing the gate line and electrically coupled to the thin film transistor, a pixel electrode electrically coupled to the thin film transistor, and a common electrode overlapping the pixel electrode and having a first opening overlapping a first pixel of the pixels, and a second opening overlapping a second pixel of the pixels adjacent the first pixel, wherein the first opening and the second opening extend in different directions, and wherein the common electrode is continuous and overlaps the first and second pixels.

The first opening and the second opening may collectively define a continuous opening, and the first pixel and the second pixel may be adjacent each other in a row direction.

The first opening may be symmetrical to the second opening with respect to the data line.

The common electrode may further have a third opening overlapping a third pixel of the pixels adjacent the first pixel in a column direction, and a fourth opening overlapping a fourth pixel of the pixels adjacent the second pixel in the column direction and adjacent the third pixel in the row direction, and the third opening may be symmetrical to the first opening with respect to the gate line, and the fourth opening may be symmetrical to the second opening with respect to the gate line.

The first opening may have a first extending portion extending in a first direction, a second extending portion extending from an end of the first extending portion in a second direction different from the first direction, and a third extending portion extending from an opposite end of the first extending portion in a third direction different from the first direction.

The second direction may be opposite to the third direction.

The second extending portion and the third extending portion may each partially overlap the pixel electrode.

The first pixel may be adjacent the second pixel in a row direction, and is spaced apart from the second pixel.

The first opening may have a first extending portion extending in a first direction, a second extending portion extending from an end of the first extending portion in a second direction different from the first direction, and a third extending portion extending from an opposite end of the first extending portion in a third direction different from the first direction.

The second extending portion and the third extending portion may respectively overlap an adjacent data line.

The second extending portion and the third extending portion may be spaced apart from an adjacent data line in a plan view.

The display substrate may further include a common line electrically coupled to the common electrode at the peripheral area.

The display substrate may further include a lower alignment layer on the common electrode and rubbed in a row direction, and an upper alignment layer below the opposing substrate and rubbed in a row direction.

According to one aspect of example embodiments of the present invention, a liquid crystal display panel includes a display substrate including a display area corresponding to a plurality of pixels, and a peripheral area surrounding the display area, an opposing substrate coupled to the display substrate, a liquid crystal layer between the display substrate and the opposing substrate, a thin film transistor for driving a corresponding one of the pixels on the display substrate, a gate line electrically coupled to the thin film transistor, a data line crossing the gate line and electrically coupled to the thin film transistor, a pixel electrode electrically coupled to the thin film transistor, and a common electrode overlapping the pixel electrode and having a first opening overlapping a first pixel of the pixels, and a second opening overlapping with a second pixel of the pixels adjacent the first pixel, wherein the first and second openings have a zigzag shape.

The first and second openings may have a protrusion portion protruding in a column direction and having a "V" shape.

The protrusion portion may overlap the date line.

According to the above, liquid crystal molecules in a display area are aligned in different directions to form a plurality of domains. Thus, a color perceived by an observer may be relatively consistent regardless of a view angle.

Furthermore, the domains are not formed in a single pixel area, but are formed in different pixel areas. Thus, brightness decrease caused at a boundary between domains in a same pixel area may be reduced or prevented.

Also, openings of a common electrode may be symmetrical in a row direction and in a column direction so that horizontal line defects are reduced, thereby improving picture quality.

Further, a common electrode continuously extends in a display area. Thus, brightness decrease or contrast decrease caused at a boundary between pixel areas may be reduced or prevented. Furthermore, when the common electrode continuously extends in the display area, a common line formed in the display area is not required, so that an opening ratio substantially increases.

BRIEF DESCRIPTION OF THE DRAWINGS

Example embodiments of the present invention can be understood in more detail from the following description taken in conjunction with the accompanying drawings, in which.

DETAILED DESCRIPTION

Figure 1:
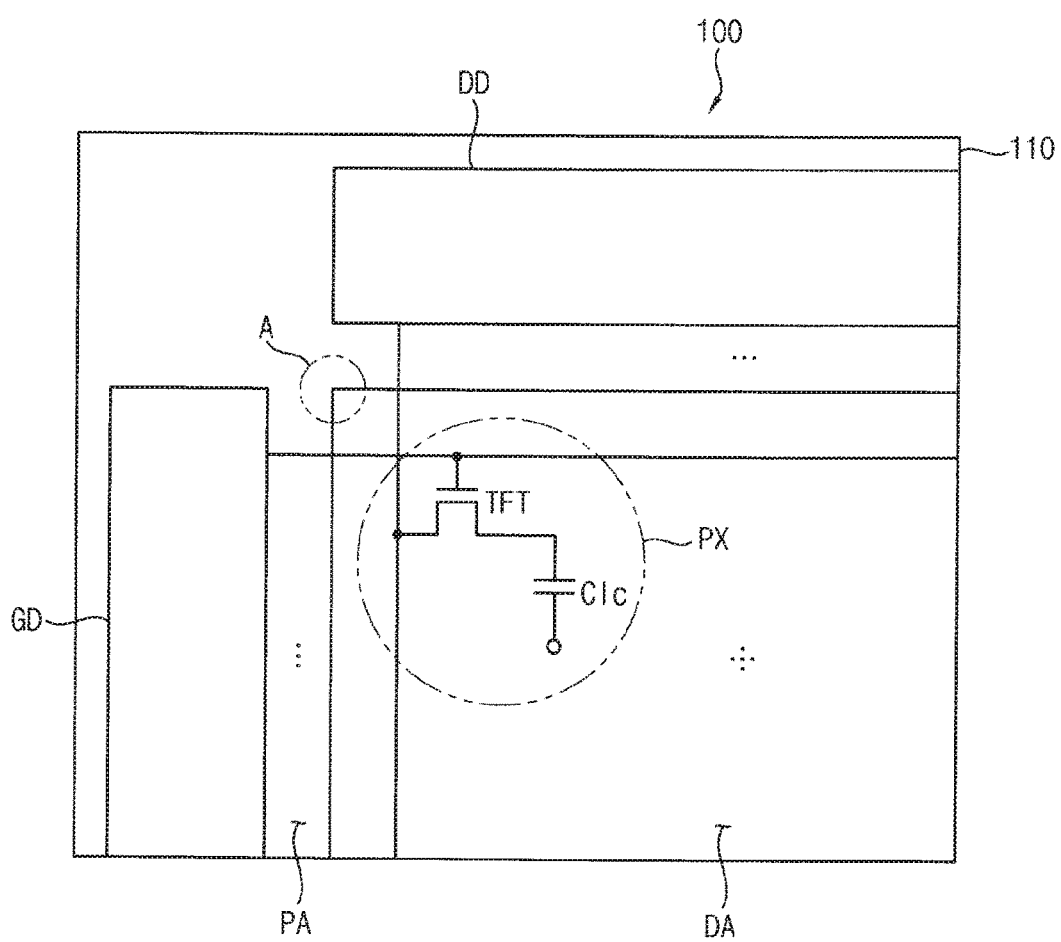
FIG. 1 is a plan view illustrating a display substrate according to an example embodiment of the present invention.

The example embodiments of the present invention are described more fully hereinafter with reference to the accompanying drawings. However, the present invention may be embodied in many different forms, and should not be construed as limited to the example embodiments set forth herein. In the drawings, the sizes and relative sizes of layers and regions may be exaggerated for clarity.

It will be understood that when an element or layer is referred to as being "on," "coupled to" or "coupled to" another element or layer, it can be directly on, directly coupled to, or directly coupled to the other element or layer, or one or more intervening elements or layers may be present. In contrast, when an element is referred to as being "directly on," "directly coupled to" or "directly coupled to" another element or layer, no intervening elements or layers are present. Like or similar reference numerals refer to like or similar elements throughout. As used herein, the term "and/or" includes any and all combinations of one or more of the associated listed items.

It will be understood that, although the terms "first," "second," "third," etc. may be used herein to describe various elements, components, regions, layers, patterns, and/or sections, these elements, components, regions, layers, patterns, and/or sections should not be limited by these terms. These terms are only used to distinguish one element, component, region, layer pattern or section from another region, layer, pattern or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use/operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be further oriented differently (rotated 90 degrees or at other orientations), and the spatially relative descriptors used herein should be interpreted accordingly.

The terminology used herein is for the purpose of describing particular example embodiments only, and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross sectional illustrations that are schematic illustrations of example embodiments (and intermediate structures) of the present invention. As such, variations from the shapes of the illustrations as a result, for example, of manufacturing techniques and/or tolerances, are to be expected. Thus, example embodiments should not be construed as being limited to the particular shapes of regions illustrated herein, but should be construed as including deviations in shapes that result, for example, from manufacturing. The regions illustrated in the figures are schematic in nature, and their shapes are not intended to illustrate the actual shape of a region of a device, and are not intended to limit the scope of the present invention.

Unless otherwise defined, all terms (including technical and scientific terms) used herein have the meaning that is commonly understood by one of ordinary skill in the art to which embodiments of the present invention belongs. It will be further understood that terms should be interpreted as having a meaning that is consistent with the meanings defined in commonly used dictionaries and in the context of the relevant art, and the terms will not be interpreted in an idealized or overly formal sense unless expressly so defined herein.

FIG. 1 is a plan view illustrating a display substrate according to an example embodiment of the present invention. Referring to FIG. 1, a display substrate 100 is categorized as a display area DA for displaying an image, and a peripheral area PA surrounding the display area DA.

The display substrate 100 includes a base substrate 110, a plurality of pixels PX located at the display area DA of the base substrate 110, and a driving part located at the peripheral area PA of the base substrate 110.

Each of the pixels PX includes a pixel thin film transistor TFT. Thus, the display substrate 100 includes a thin film transistor array including a plurality of thin film transistors arranged in a matrix configuration. The pixel thin film transistor TFT may include an NMOS transistor. The pixel PX includes a pixel electrode PE coupled to the pixel thin film transistor TFT to form a liquid crystal capacitor Clc, and also includes a common electrode CE. In another embodiment of the present invention, the pixel PX may further include a storage line and/or a storage electrode to form a storage capacitor.

The driving part at the peripheral area PA includes a gate driving part GD and a data driving part DD. The gate driving part GD provides a gate signal(s) to the pixel PX, and the data driving part DD provides a data signal(s) to the pixel PX. The gate driving part GD and the data driving part DD may include a circuit transistor, which may be a CMOS transistor including a PMOS transistor or an NMOS transistor, integrated on the base substrate 110.

Figure 2:
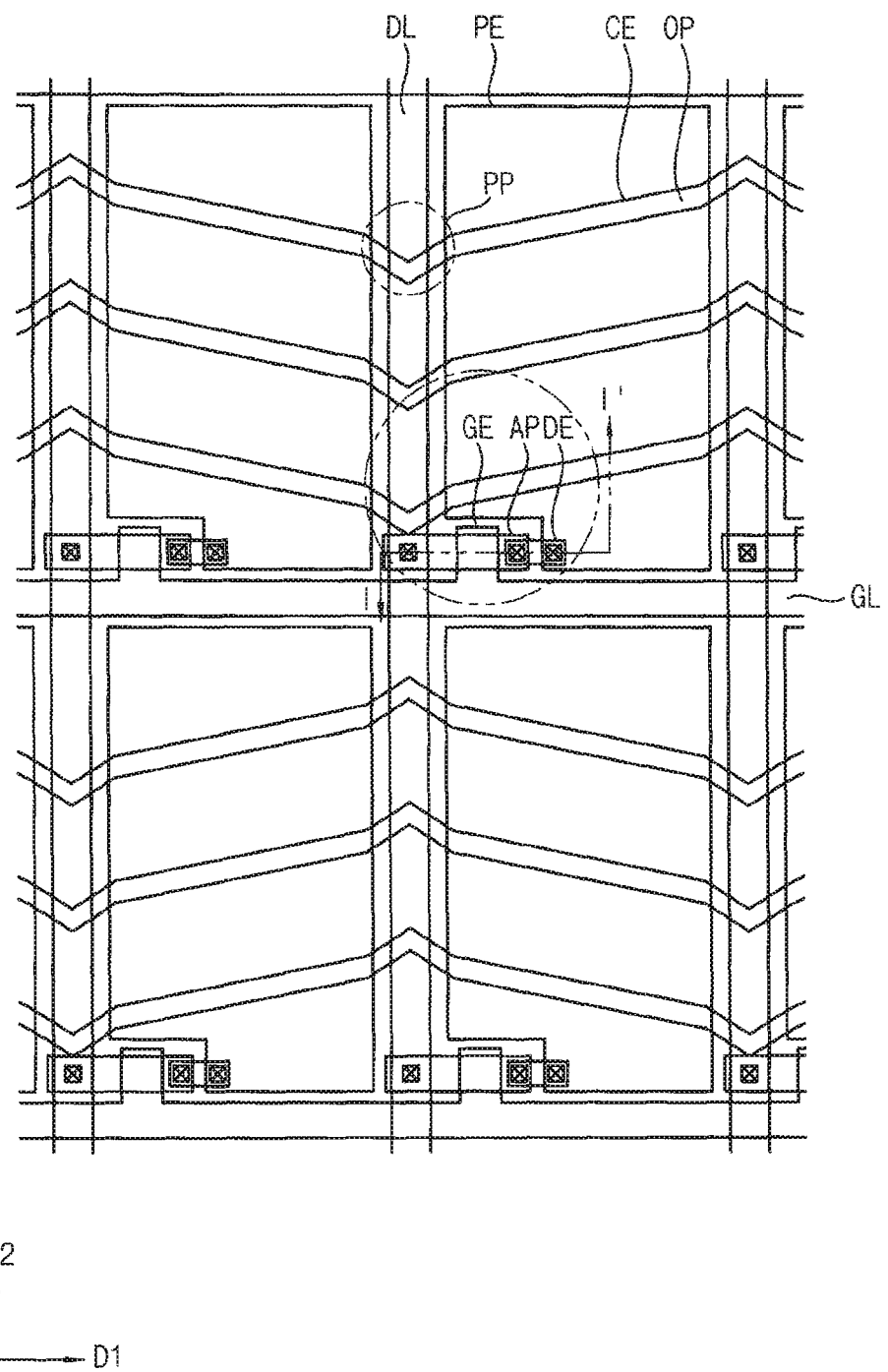
FIG. 2 is an enlarged plan view illustrating a pixel of the display substrate of the embodiment illustrated in FIG. 1.
Figure 3:
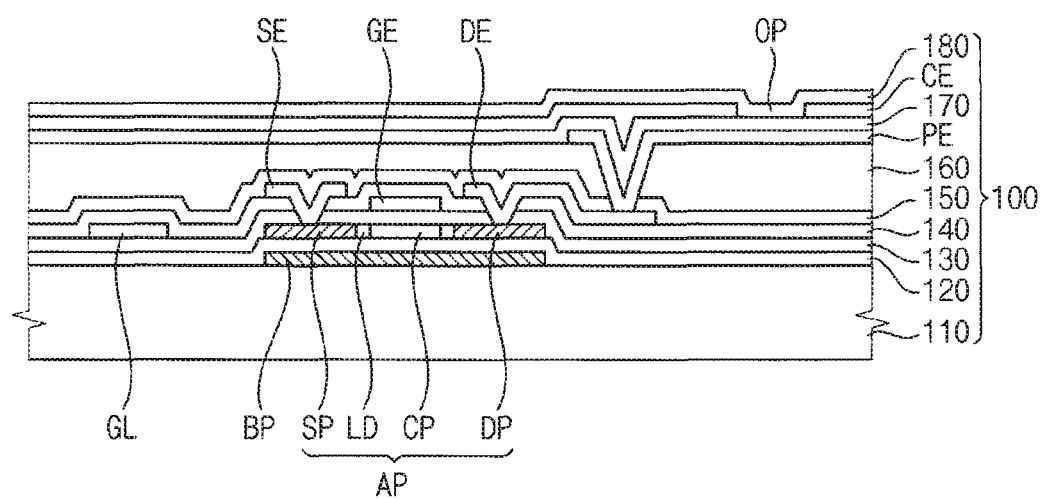
FIG. 3 is a cross-sectional view illustrating the display substrate of FIG. 2 taken along the line I-I'.
Figure 4:
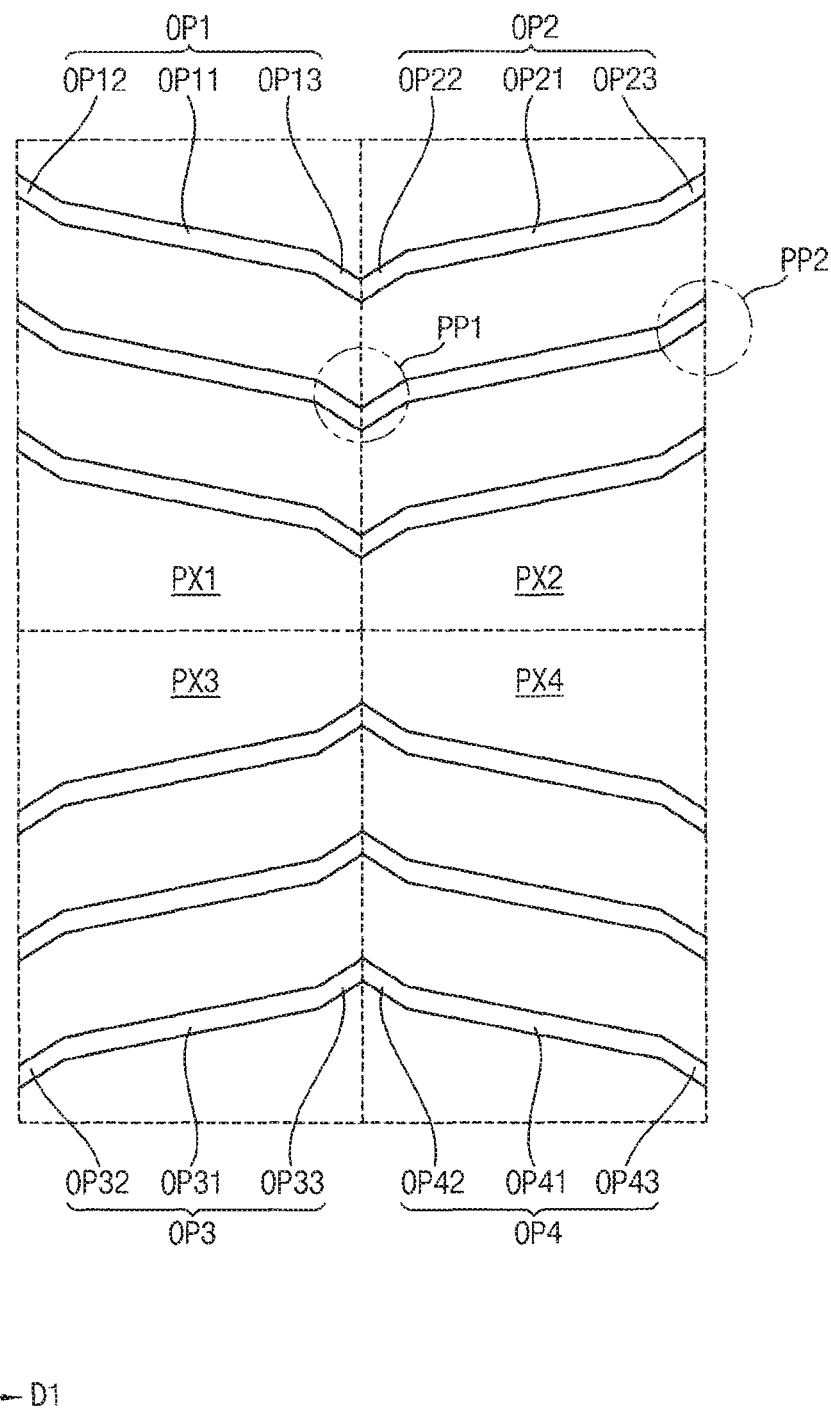
FIG. 4 is a plan view illustrating a common electrode of the embodiment illustrated in FIG. 2.

FIG. 2 is an enlarged plan view illustrating a pixel of the display substrate of the embodiment illustrated in FIG. 1. FIG. 3 is a cross-sectional view illustrating the display substrate of FIG. 2 taken along the line I-I'. FIG. 4 is a plan view illustrating a common electrode illustrated in FIG. 2.

Referring to FIGS. 2 and 3, a display substrate 100 includes a gate line GL, a data line DL, a gate electrode GE, a source electrode SE, a drain electrode DE, an active pattern AP, a pixel electrode PE, and a common electrode CE. The gate electrode GE, the source electrode SE, the drain electrode DE, and the active pattern AP form the pixel thin film transistor TFT.

The gate line GL is electrically coupled to the gate driving part GD, and extends in a first direction. For example, the gate line GL may extend in a row direction D1 of the display substrate 100. Examples of a material that may be used for the gate line GL may include, for example, copper, chromium, nickel, molybdenum, manganese, titanium, silver, aluminum, an alloy thereof, and/or the like. The gate line GL may have a single-layered structure, or a multiple-layered structure including different metal layers. For example, the gate line GL may have a single-layered structure of a copper layer, or may have a double-layered structure including a titanium layer located under a copper layer. Alternatively, the gate line GL may include a metal layer and an oxide barrier layer located on and/or under the copper layer. For example, the gate line GL may include a copper layer, an indium-zinc oxide layer on the copper layer, and an indium-zinc oxide layer under the copper layer.

The gate electrode GE is electrically coupled to the gate line GL to receive a gate signal from the gate driving part GD. For example, the gate electrode GE may have a shape protruding from the gate line GL. The gate electrode GE may be formed from a same layer (e.g., in a same order, or at a same time) as the gate line GL. In another embodiment, the gate electrode GE may be separated from the gate line GL, and may be electrically coupled to the gate line GL through a bridge. Furthermore, the gate electrode GE may include a material that is different from that of the gate line GL.

The data line DL is electrically coupled to the data driving part DD, and extends in a second direction to cross the gate line GL. For example, the data line DL may extend in a column direction D2 of the display substrate 100. The data line DL may have a single-layered structure of copper, chromium, nickel, molybdenum, manganese, titanium, silver, aluminum, or an alloy thereof, or may have a multiple-layered structure including different metal layers. Furthermore, the data line DL may include a metal layer and an oxide barrier layer located on and/or under the copper layer.

The source electrode SE is electrically coupled to the data line DL to receive a source signal from the data driving part DD. In the present embodiment, the source electrode SE is defined by a portion of the data line DL (e.g., the source electrode SE and the data line DL may be continuously formed). In another embodiment, the source electrode SE may have a shape protruding from the data line DL. In another embodiment, the source electrode SE may be separated from the data line DL, and may be electrically coupled to the data line DL through a bridge. Furthermore, the source electrode SE may include a material that is different from that of the data line DL.

The drain electrode DE is spaced apart from the source electrode SE, is formed from a same layer as the data line DL and the source electrode SE, and is electrically coupled to the pixel electrode PE.

The active pattern AP includes a source portion SP, a drain portion DP, and a channel portion CP between the source portion SP and the drain portion DP. A low-concentration-doped portion LD is located between the source portion SP and the channel portion CP, and also between the drain portion DP and the channel portion CP. The source portion SP, the drain portion DP, the channel portion CP, and the low-concentration-doped portion LD are formed from a same layer.

The source portion SP is electrically coupled to the source electrode SE, and the drain portion DP is electrically coupled to the drain electrode DE. The channel portion CP overlaps with the gate electrode GE in a plan view (e.g., the gate electrode GE is above the channel portion CP). When a gate signal is applied to the gate electrode GE, a conductivity of the channel portion CP is increased so that a data signal provided to the source portion SP is provided to the pixel electrode PE through the channel portion CP, the drain portion DP, and the drain electrode DE.

The active pattern AP may include polycrystalline silicon. The source portion SP and the drain portion DP may include polycrystalline silicon doped with impurities of high concentration. The low-concentration-doped portion LD may include polycrystalline silicon doped with impurities of low concentration. The channel portion CP may include polycrystalline silicon that is not doped. For example, the source portion SP, the drain portion DP, and the low-concentration-doped portion LD may be doped with N-type impurities.

The common electrode CE overlaps with the pixel electrode PE, is electrically insulated from the pixel electrode PE, and has a common voltage provided thereto. The common electrode CE continuously overlaps with at least two pixel electrodes adjacent (e.g., next to) each other in the row direction D1. Preferably, the common electrode CE continuously extends in the row direction D1 in the display area DA (e.g., comprises a number of continuous pieces extending in the row direction D1). Furthermore, the common electrode CE includes an opening OP overlapping with the pixel electrode PE. In an embodiment of the present invention, the opening OP extends substantially in the row direction D1 in the display area DA. Thus, the opening OP crosses the data line DL, and the common electrode CE is made of a plurality of electrode portions spaced apart from each other (e.g., separated by openings such as the opening OP) in the column direction D2 in the display area DA.

Furthermore, the opening OP includes a protrusion portion PP protruding in the column direction D2 (e.g., the protrusion portion PP may extend further in the column direction D2 then a remaning portion of the opening OP). The protrusion portion PP overlaps with the data line DL, and may have a V-shape. The common electrode CE and the opening OP will be explained more fully in the following.

Referring to FIG. 3, the display substrate 100 includes a light-blocking pattern BP formed on the base substrate 110. The light-blocking pattern BP overlaps with the active pattern AP, and is located between the active pattern AP and the base substrate 110. Thus, the light-blocking pattern BP blocks an incident light from below the active pattern AP to reduce or prevent the incident light from entering the active pattern AP. Thus, change of electrical characteristics of the thin film transistor may be reduced or prevented. Examples of a material that may be used for the light-blocking pattern BP may include a metal, an organic material, polycrystalline silicon, and/or the like.

A first insulation layer 120 is formed on the light-blocking pattern BP. The first insulation layer 120 may include an insulation material such as silicon nitride, silicon oxide, or the like. The active pattern AP is formed on the first insulation layer 120, and overlaps with the light-blocking pattern BP.

A second insulation layer 130 is formed on the active pattern AP, and may include an insulation material such as silicon nitride, silicon oxide, or the like. The gate line GL and the gate electrode GE are formed on the second insulation layer 130.

A third insulation layer 140 is formed on the gate line GL and the gate electrode GE, and may include an insulation material such as silicon nitride, silicon oxide, or the like. The data line DL, the source electrode SE, and the drain electrode DE are formed on the third insulation layer 140. The source electrode SE contacts the source portion SP of the active pattern AP through a contact hole in the second third insulation layers 130 and 140. The drain electrode DE contacts the drain portion DP of the active pattern AP through a different contact hole in the second and third insulation layers 130 and 140.

A fourth insulation layer 150 and a fifth insulation layer 160 are formed on the data line DL, the source electrode SE, and the drain electrode DE. The fourth insulation layer 150 may include an insulation material such as silicon nitride, silicon oxide, or the like. The fifth insulation layer 160 compensates for height difference to planarize an upper surface of the display substrate 100 (e.g., a planarization layer). The fifth insulation layer 160 may include an organic insulation material. The pixel electrode PE is formed on the fifth insulation layer 160, and contacts the drain electrode DE though a contact hole formed through the fourth insulation layer 150 and the fifth insulation layer 160.

A sixth insulation layer 170 is formed on the pixel electrode PE, and may include an insulation material such as silicon nitride, silicon oxide, or the like. In another embodiment, the sixth insulation layer 170 may include an organic insulation material. The common electrode CE is formed on the sixth insulation layer 170.

In an embodiment of the present invention, the common electrode CE is located on the pixel electrode PE. In another embodiment of the present invention, the common electrode CE may be located under the pixel electrode PE.

A lower alignment layer 180 is located on the common electrode CE, and is rubbed in a direction so that liquid crystal molecules located between the display substrate 100 and an opposing substrate are orientated in a direction to have a pretilt angle. In an embodiment of the present invention, a rubbing direction of the lower alignment layer 180 is substantially parallel to the row direction D1 of the display substrate 100.

Referring to FIGS. 2 and 4, the opening OP includes a first protrusion portion PP1 protruding in the column direction D2, and a second protrusion portion PP2 protruding in the column direction D2 in a direction opposite to the protruding direction of the first protrusion portion PP1. The first and second protrusion portions PP1 and PP2 respectively overlap with corresponding data lines DL.

Particularly, a first opening OP1 in a first pixel area PX1 includes a first extending portion OP11 extending in a first direction, a second extending portion OP12 extending from an end (e.g., a first end) of the first extending portion OP11 in a second direction, and a third extending portion OP13 extending from an opposite end (e.g., a second end) of the first extending portion OP11 in a third direction. The first extending portion OP11, the second extending portion OP12, and the third extending portion OP13 are continuously coupled to each other (e.g., the first, second, and third opening portions OP11, OP12, and OP13 collectively form a continuous first opening OP1).

In an embodiment of the present invention, the first direction is different from the second direction, and the second direction is substantially parallel to the third direction. Thus, the second direction is opposite to the third direction (e.g., the second and third extending portions OP12 and OP 13 extend in opposite directions from first extending portion OP11). The first direction is tilted to the row direction D1 such that the first direction is not parallel to either the gate line GL or the data line DL.

In an embodiment of the present invention, the first extending portion OP11 is entirely overlapped with the pixel electrode PE, and the second extending portion OP12 and the third extending portion OP13 are partially overlapped with the pixel electrode PE.

In an embodiment of the present invention, the first pixel area PX1 includes a plurality of first openings OP1 spaced apart from each other in the column direction D2. The first opening OP1 is coupled to a second opening OP2, which is in a second pixel area PX2 that is adjacent the first pixel area PX1, in the row direction D1. The second opening OP2 has a shape symmetrical to that of the first opening OP1 with respect to the data line DL.

The second opening OP2 includes a first extending portion OP21 extending in a fourth direction, a second extending portion OP22 extending from an end of the first extending portion OP21 in a fifth direction, and a third extending portion OP23 extending from an opposite end of the first extending portion OP21 in a sixth direction. The first extending portion OP21, the second extending portion OP22, and the third extending portion OP23 are continuously coupled to each other (e.g., to form a continuous second opening OP2). The second extending portion OP22 of the second opening OP2 is coupled to the third extending portion OP13 of the first opening OP1 to form the protrusion portion PP.

In an embodiment of the present invention, the fourth direction is different from the fifth direction, and the fifth direction is substantially parallel to (e.g., opposite to) the sixth direction. The fourth direction is tilted to the row direction D1 such that the fourth direction is not parallel to either the gate line GL or the data line DL.

A third opening OP3 in a third pixel area PX3, which is adjacent the first pixel area PX1 in the column direction D2, has a shape symmetrical to that of the first opening OP1 with respect to the gate line GL (e.g., the third opening OP3 and the first opening OP1 are symmetrical with respect to the gate line GL). Thus, the third opening OP3 has substantially a same shape (e.g., shape and direction) as the second opening OP2. Particularly, the third opening OP3 includes a first extending portion OP31, a second extending portion OP32, and a third extending portion OP33, which are continuously coupled to each other.

A fourth opening OP4 in a fourth pixel area PX4, which is adjacent the second pixel area PX2 in the column direction D2 and is also adjacent the third pixel area PX3 in the row direction D1, has a shape symmetrical to the second opening OP2 with respect to the gate line GL. Furthermore, the fourth opening OP4 has a shape symmetrical to the third opening OP3 with respect to the data line DL. Thus, the fourth opening OP4 has substantially a same shape (e.g., same shape and direction) as the first opening OP1. Particularly, the fourth opening OP4 includes a first extending portion OP41, a second extending portion OP42, and a third extending portion OP43, which are continuously coupled to each other (e.g., the first extending portion OP41, the second extending portion OP42, and the third extending portion OP43 collectively form, or define, the fourth opening OP4).

Thus, the common electrode CE in an embodiment has a repeating unit (e.g., a repeating pattern) including four pixel areas corresponding to two rows and two columns (e.g., the four pixel areas being in a 2 by 2 matrix). First to fourth pixels, which respectively correspond to the first to fourth pixel areas PX1, PX2, PX3 and PX4, are coupled to different thin film transistors to be independently driven.

Figure 5:
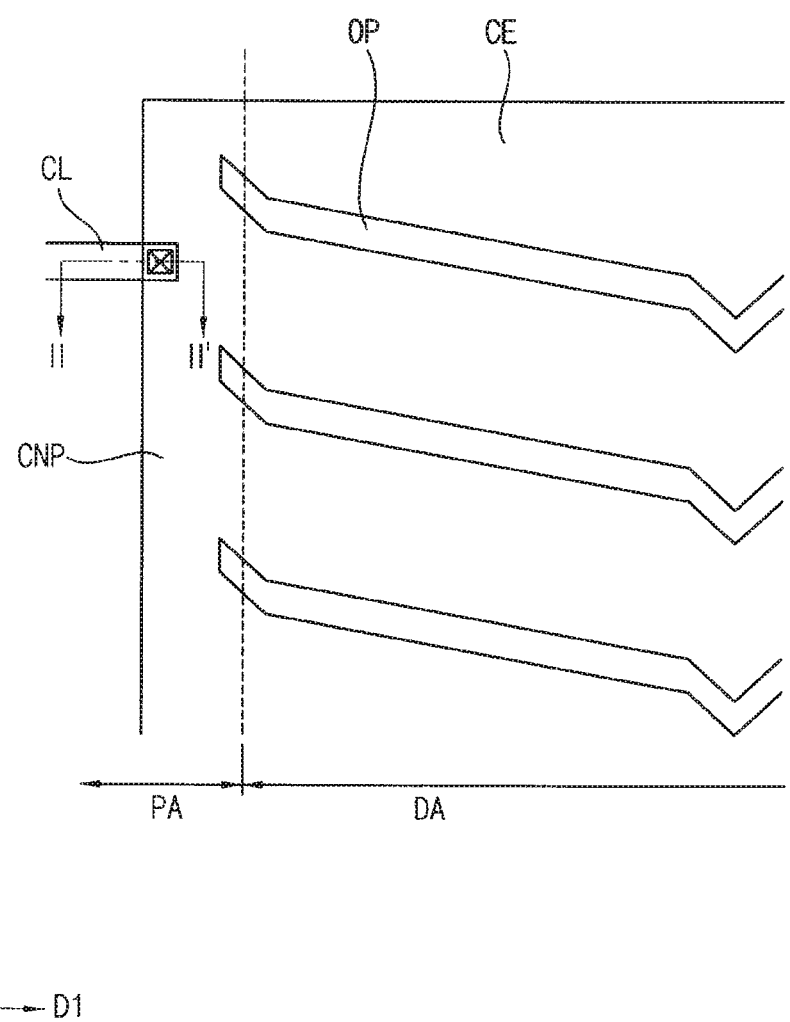
FIG. 5 is an enlarged plan view illustrating the region 'A' of the display substrate illustrated in FIG. 1.
Figure 6:
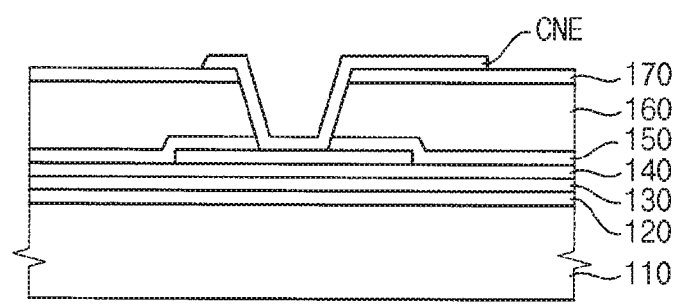
FIG. 6 is a cross-sectional view illustrating the display substrate of FIG. 5 taken along the line II-II'.

FIG. 5 is an enlarged plan view illustrating the region CA of the display substrate of the embodiment illustrated in FIG. 1. FIG. 6 is a cross-sectional view illustrating the display substrate of FIG. 5 taken along the line II-II'. Referring to FIGS. 5 and 6, the common electrode CE overlaps the peripheral area PA as well as the display area DA, and is electrically coupled to a common line CL.

The common line CL is located at the peripheral area PA, and may be formed from a same layer as the gate line GL. For example, the common line CL is formed on the first insulation layer 120 and the second insulation layer 130.

The common electrode CE includes a connection portion CNP located in the peripheral area PA, and which contacts the common line CL through a contact hole formed through the third through sixth insulation layers 140, 150, 160, and 170. Accordingly, a common voltage may be provided to the common electrode CE from the common line CL.

The connection portion CNP continuously extends (e.g., extends as a continuous piece of material) in the column direction D2. Thus, even if the portion of the common electrode CE in the display area DA is divided into a plurality of electrode portions by the openings OP, the common voltage may be applied to an entirety of the common electrode CE.

Figure 7:
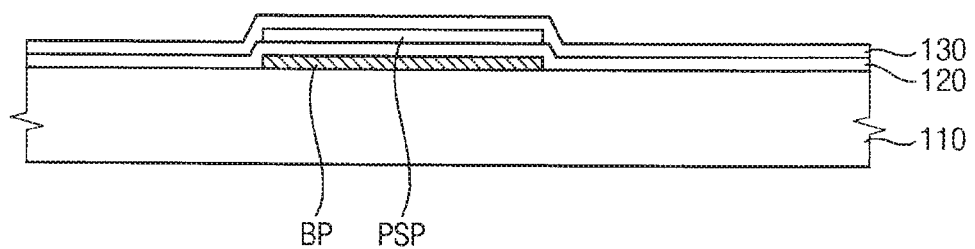
FIGS. 7 to 15 are cross-sectional views illustrating a method of manufacturing a display substrate according to an example embodiment of the present invention.

FIGS. 7 to 15 are cross-sectional views illustrating a method of manufacturing a display substrate according to an example embodiment of the present invention. Referring to FIG. 7, a light-blocking pattern BP, a first insulation layer 120, a polycrystalline silicon pattern PSP, and a second insulation layer 130 are formed on a base substrate 110.

The base substrate 110 may be a transparent substrate. Examples of the base substrate 110 may include a glass substrate, a soda lime substrate (e.g., soda-lime-silica glass substrate), a plastic substrate and/or the like.

A light-blocking layer including a material capable of reflecting or absorbing a light is formed on the base substrate 110, and is patterned through a photolithography or the like to form the light-blocking pattern BP. Thereafter, the first insulation layer 120 is formed to cover the light-blocking pattern BP.

Thereafter, an amorphous silicon layer is formed on the first insulation layer 120, and is dehydrogenated, crystallized by using a laser or the like, and patterned through a photolithography or the like to form the polycrystalline silicon pattern PSP. At least a portion of the polycrystalline silicon pattern PSP overlaps with the light-blocking pattern BP. Thereafter, the second insulation layer 130 covering the polycrystalline silicon pattern PSP is formed.

Figure 8:
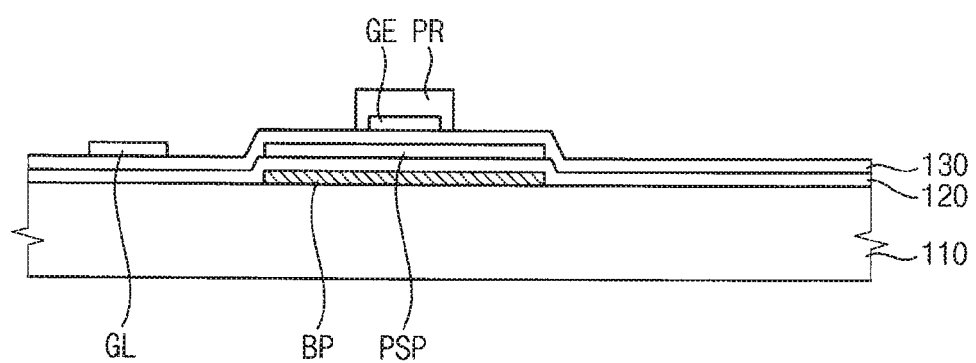

Referring to FIG. 8, a gate metal layer is formed on the second insulation layer 130, and is patterned to form a gate line GL and a gate electrode GE. The gate electrode GE overlaps with the polycrystalline silicon pattern PSP.

Thereafter, a photoresist pattern PR is formed to cover the gate electrode GE. The photoresist pattern PR has a width larger than a width of the gate electrode GE in a plan view, and thus covers a side surface (e.g., the sides, or the top and sides) of the gate electrode GE.

Figure 9:
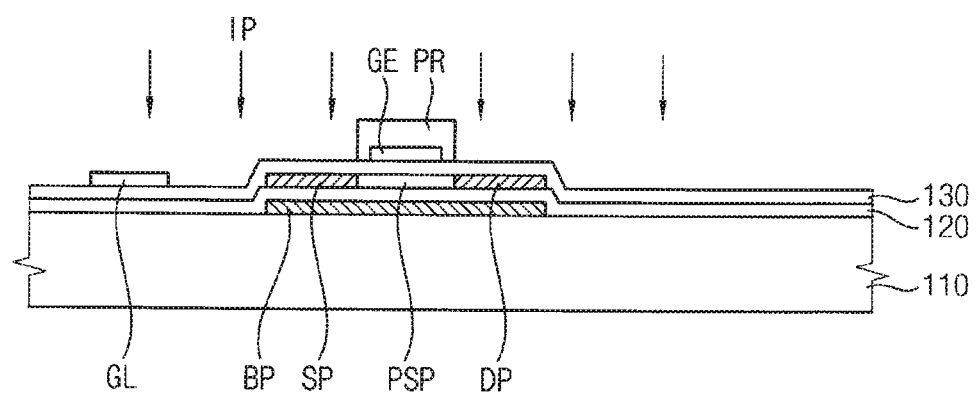

Referring to FIG. 9, an ion IP having a high concentration is implanted into a portion of the polycrystalline silicon pattern PSP by using the photoresist pattern PR as a mask to form a source portion SP and a drain portion DP. The ion IP is not implanted into a portion of the polycrystalline silicon pattern PSP, which overlaps with (e.g., is covered by) the photoresist pattern PR.

Figure 10:
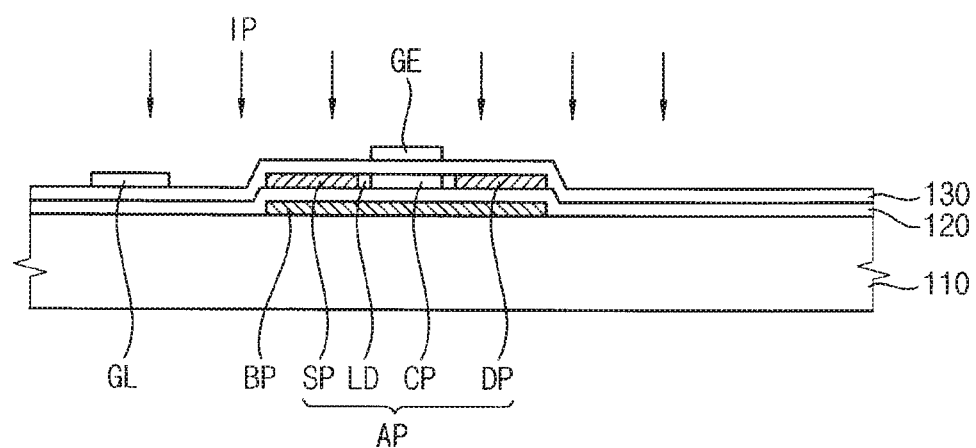

Referring to FIG. 10, the photoresist pattern PR is removed. Thereafter, an ion IP having a low concentration is implanted into a portion of the polycrystalline silicon pattern PSP by using the gate electrode GE as a mask to form a low-concentration-doped portion LD. The ion IP is not implanted into a portion of the polycrystalline silicon pattern PSP that overlaps with the gate electrode GE, and this portion forms a channel portion CP. The low-concentration-doped portion LD is formed between the source portion SP and the channel portion CP, and between the drain portion DP and the channel portion CP.

In another embodiment of the present invention, after the gate electrode GE is formed, an ion having a low concentration may be implanted into a portion of the polycrystalline silicon pattern PSP. Thereafter, a photoresist pattern may be formed, and an ion having a high concentration may be implanted into a portion of a low-concentration-doped portion LD to form the drain portion DP and the channel portion CP.

In another embodiment of the present invention, the process for forming the low-concentration-doped portion LD may be omitted.

Figure 11:
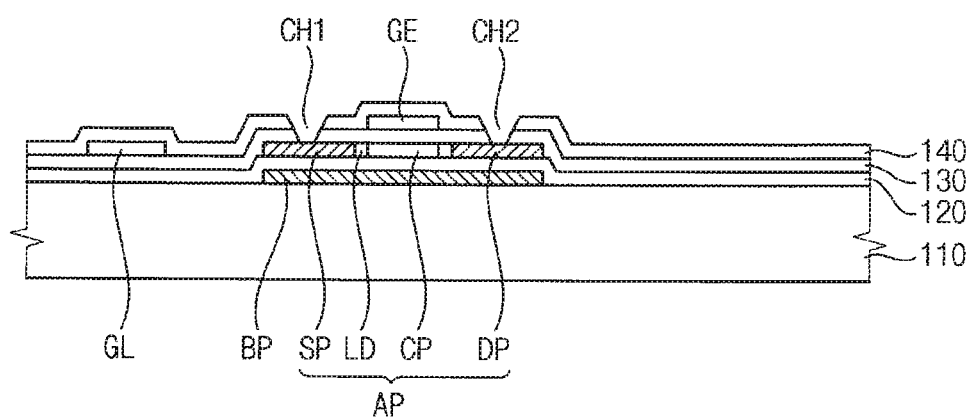

Referring to FIG. 11, a third insulation layer 140 is formed on the second insulation layer 130 to cover the gate electrode GE and the gate line GL. Thereafter, the second and third insulation layers 130 and 140 are patterned to form a first contact hole CH1 exposing the source portion SP, and a second contact hole CH2 exposing the drain portion DP.

Figure 12:
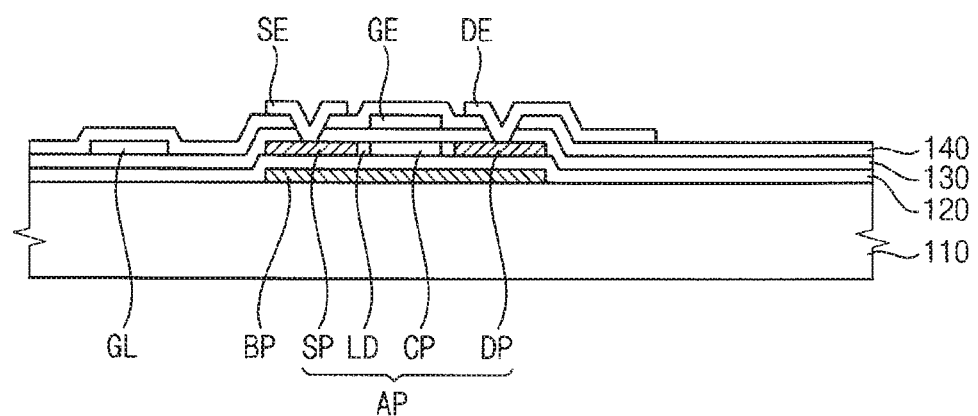

Referring to FIG. 12, a data metal layer is formed on the third insulation layer 140, and is patterned to form a source electrode SE contacting the source portion SP through the first contact hole CH1, a drain electrode contacting the drain portion DP through the second contact hole CH2, and a data line (e.g., a portion of the data line DL).

Figure 13:
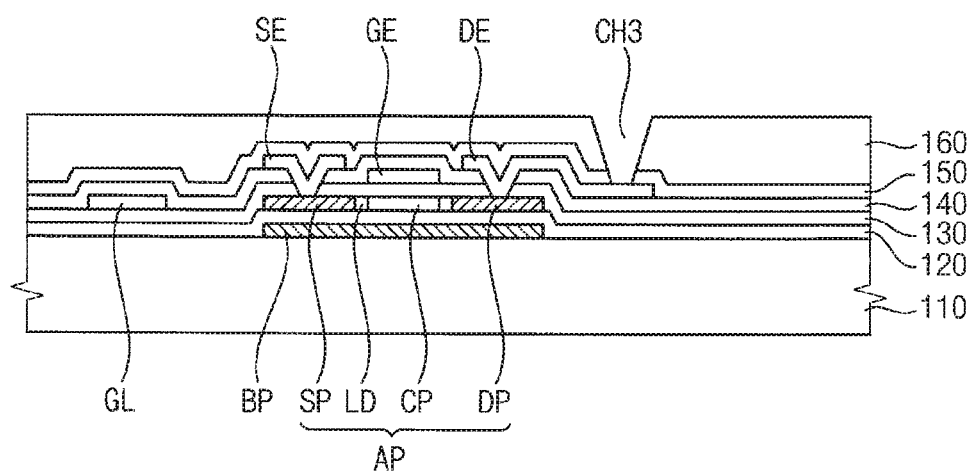

Referring to FIG. 13, a fourth insulation layer 150 is formed on the third insulation layer 140 to cover the source electrode SE, the drain electrode DE, and the data line. Then, a fifth insulation layer 160 is formed on the fourth insulation layer 150. Thereafter, the fourth and fifth insulation layers 150 and 160 are patterned to form a third contact hole CH3 exposing the drain electrode DE.

Figure 14:
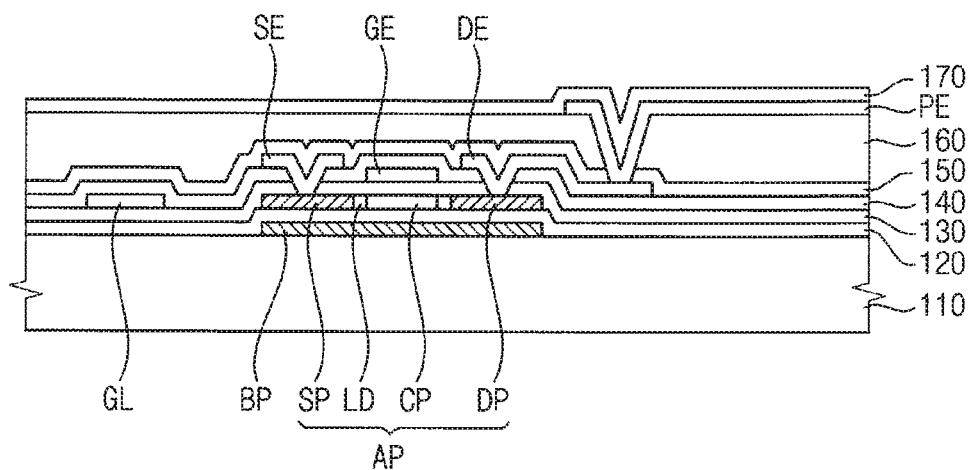

Referring to FIG. 14, a pixel electrode layer is formed on the fifth insulation layer 160, and is patterned to form a pixel electrode PE. Examples of a material that may be used for the pixel electrode layer may include a transparent conductive material such as indium tin oxide, indium zinc oxide or the like.

Thereafter, a sixth insulation layer 170 is formed on the fifth insulation layer 160 to cover the pixel electrode PE.

Figure 15:
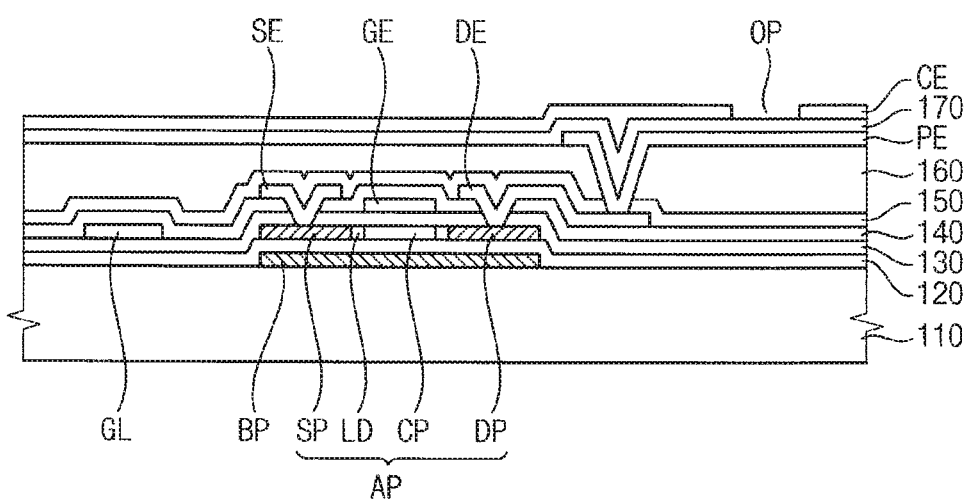

Referring to FIG. 15, a common electrode layer is formed on the sixth insulation layer 170, and is patterned to form a common electrode CE having an opening OP. Examples of a material that may be used for the common electrode layer may include a transparent conductive material such as indium tin oxide, indium zinc oxide, or the like. The opening OP overlaps with the pixel electrode PE.

Figure 16:
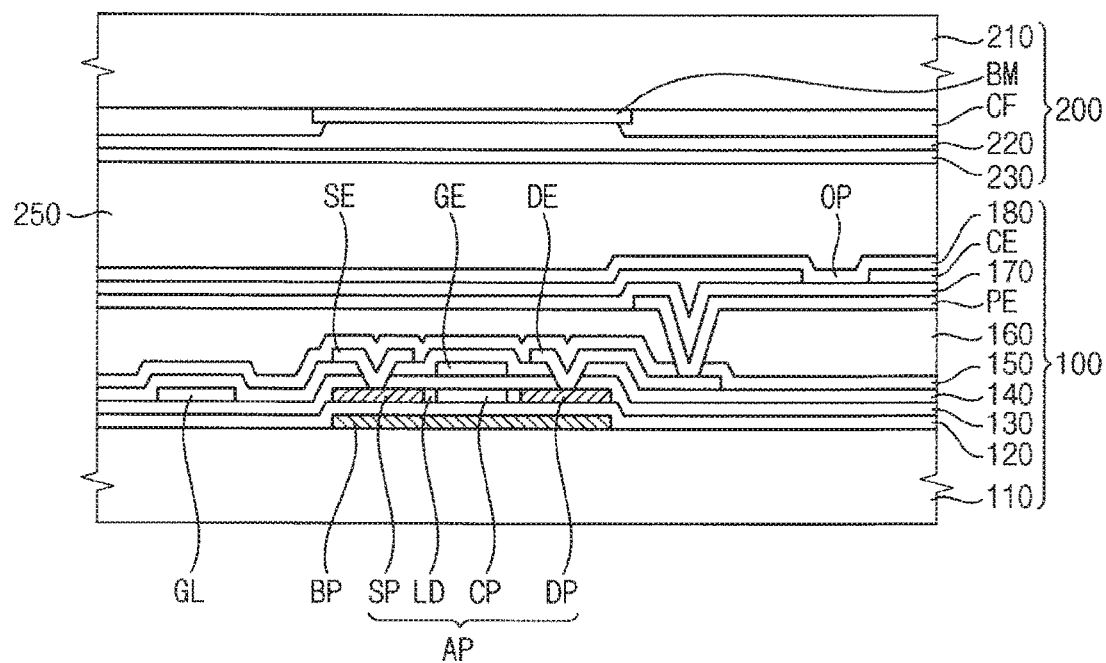
FIG. 16 is a cross-sectional view illustrating a liquid crystal display panel according to an example embodiment of the present invention.

Thereafter, a lower alignment layer 180, shown in FIG. 16, is formed to cover the common electrode layer CE. For example, an alignment composition including a polyimide resin is coated on the common electrode CE to form an alignment layer 180, and the alignment layer 180 may be rubbed (e.g., rubbed in a predetermined direction) by using a rubbing fabric or the like to form the lower alignment layer 180.

In an embodiment of the present invention, the thin film transistor includes a polycrystalline silicon channel portion. However, a thin film transistor including amorphous silicon, an oxide semiconductor, or the like may be used for the invention.

In another embodiment of the present invention, the common electrode CE may be located under the pixel electrode PE.

Figure 17:
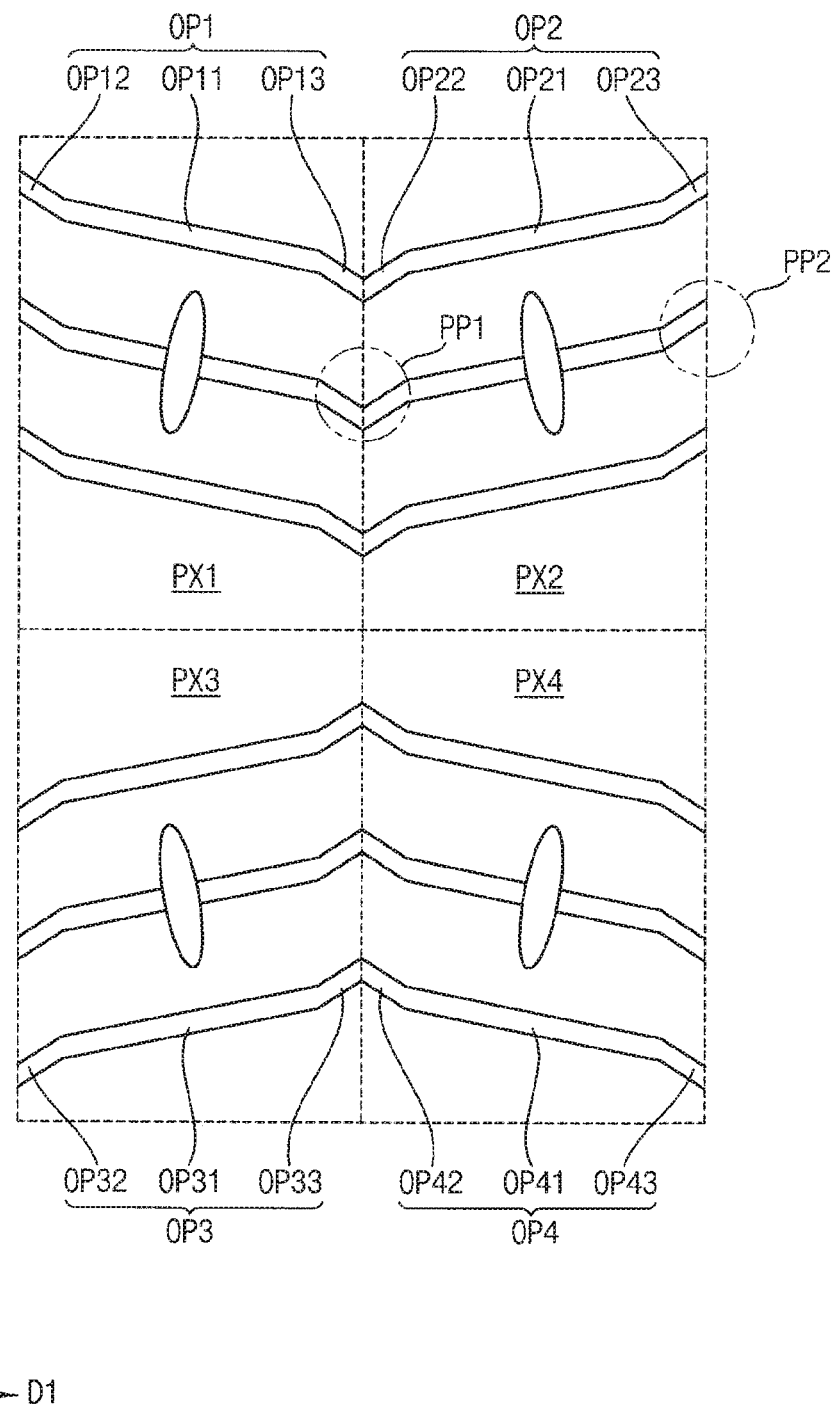
FIG. 17 is a plan view illustrating liquid crystal molecules that are aligned on a common electrode and a pixel electrode of the liquid crystal display panel according to an example embodiment of the present invention.

FIG. 16 is a cross-sectional view illustrating a liquid crystal display panel according to an example embodiment of the present invention. FIG. 17 is a plan view illustrating liquid crystal molecules aligned on a common electrode and a pixel electrode of the liquid crystal display panel.

Referring to FIG. 16, the liquid crystal display panel includes a display substrate 100, an opposing substrate 200, and a liquid crystal layer 250 between the display substrate 100 and the opposing substrate 200. The display substrate 100 and the opposing substrate 200 are combined with each other (e.g., bonded to each other) by a sealing member or the like. The display substrate 100 of the present embodiment is substantially the same as the display substrate of the embodiment illustrated in FIG. 2. Thus, duplicative explanation will be omitted.

The opposing substrate 200 includes a base substrate 210, a black matrix BM formed on a surface of the base substrate 210, a color filter CF formed on the surface of the base substrate 210, a planarizing layer 220 covering the black matrix BM and the color filter CF, and an upper alignment layer 230 contacting the liquid crystal layer 250.

The upper alignment layer 230 has a rubbing direction, which may be, for example, parallel with the rubbing direction of the lower alignment layer 180. The rubbing direction of the upper alignment layer 230 may be opposite to the rubbing direction of the lower alignment layer 180.

Liquid crystal molecules of the liquid crystal layer 250 between the display substrate 100 and the opposing substrate 200 have a pretilt angle to be aligned (e.g., aligned in a predetermined direction).

FIG. 17 is a plan view for explaining behavior of liquid crystal molecules in a liquid crystal display panel according to an example embodiment of the present invention. Referring to FIG. 17, a common electrode has a first opening OP1, a second opening OP2, a third opening OP3, and a fourth opening OP4, which respectively overlap different pixel electrodes.

When a pixel voltage is applied to each of the pixel electrodes, a liquid crystal molecule LC is aligned by an electric field formed by the pixel electrode PE and the common electrode CE. For example, the liquid crystal molecule LC may be aligned such that a longitudinal axis of the liquid crystal molecule LC is perpendicular to an extending direction of the opening OP of the common electrode CE. Thus, a liquid crystal molecule LC in a first pixel area PX1 is aligned in a direction perpendicular to an extending direction of the first opening OP1. A liquid crystal molecule LC in a second pixel area PX2, which is adjacent the first pixel area PX1 in a row direction D1, is aligned in a direction perpendicular (e.g., substantially perpendicular) to an extending direction of the second opening OP2. A liquid crystal molecule LC in a third pixel area PX3, which is adjacent the first pixel area PX1 in a column direction D2, is aligned in a direction perpendicular (e.g., substantially perpendicular) to an extending direction of the third opening OP3. A liquid crystal molecule LC in a fourth pixel area PX4, which is adjacent the third pixel area PX3 in the row direction D1 and is also adjacent the second pixel area PX2 in the column direction D2, is aligned in a direction perpendicular to an extending direction of the fourth opening OP4.

In an embodiment of the present invention, the first opening OP1 has substantially the same shape as the fourth opening OP4. The second opening OP2 has a shape that is symmetrical to the first opening OP1 with respect to the data line, and that is substantially the same as the shape of the third opening OP3. Thus, when a same voltage is applied to each of the pixel electrodes, the liquid crystal molecule LC in the first pixel area PX1 is aligned in a same direction as the liquid crystal molecule LC in the fourth pixel area PX4, and the liquid crystal molecule LC in the second pixel area PX2 is aligned in a different direction from the liquid crystal molecule LC in the first pixel area PX1, and the liquid crystal molecule LC in the third pixel area PX3 is aligned in a same direction as the liquid crystal molecule LC in the second pixel area PX2.

According to the present embodiment, liquid crystal molecules LC in a display area DA are aligned in different directions to form a plurality of domains. Thus, a color perceived by an observer may be prevented from varying (e.g., may have a reduced degree of varying) due to changes in a view angle.

Furthermore, the domains are not formed in a pixel area, but are formed in different pixel areas. Thus, brightness decrease caused at a boundary between domains formed in a same pixel area may be reduced or prevented.

Furthermore, a common electrode CE continuously extends in a display area DA (e.g., is formed of a single piece of material). Thus, decrease in brightness or in contrast caused at a boundary between pixel areas may be reduced or prevented. Furthermore, when the common electrode CE continuously extends in the display area DA, a common line CL formed in the display area DA is not required so that an opening ratio substantially increases.

Figure 18:
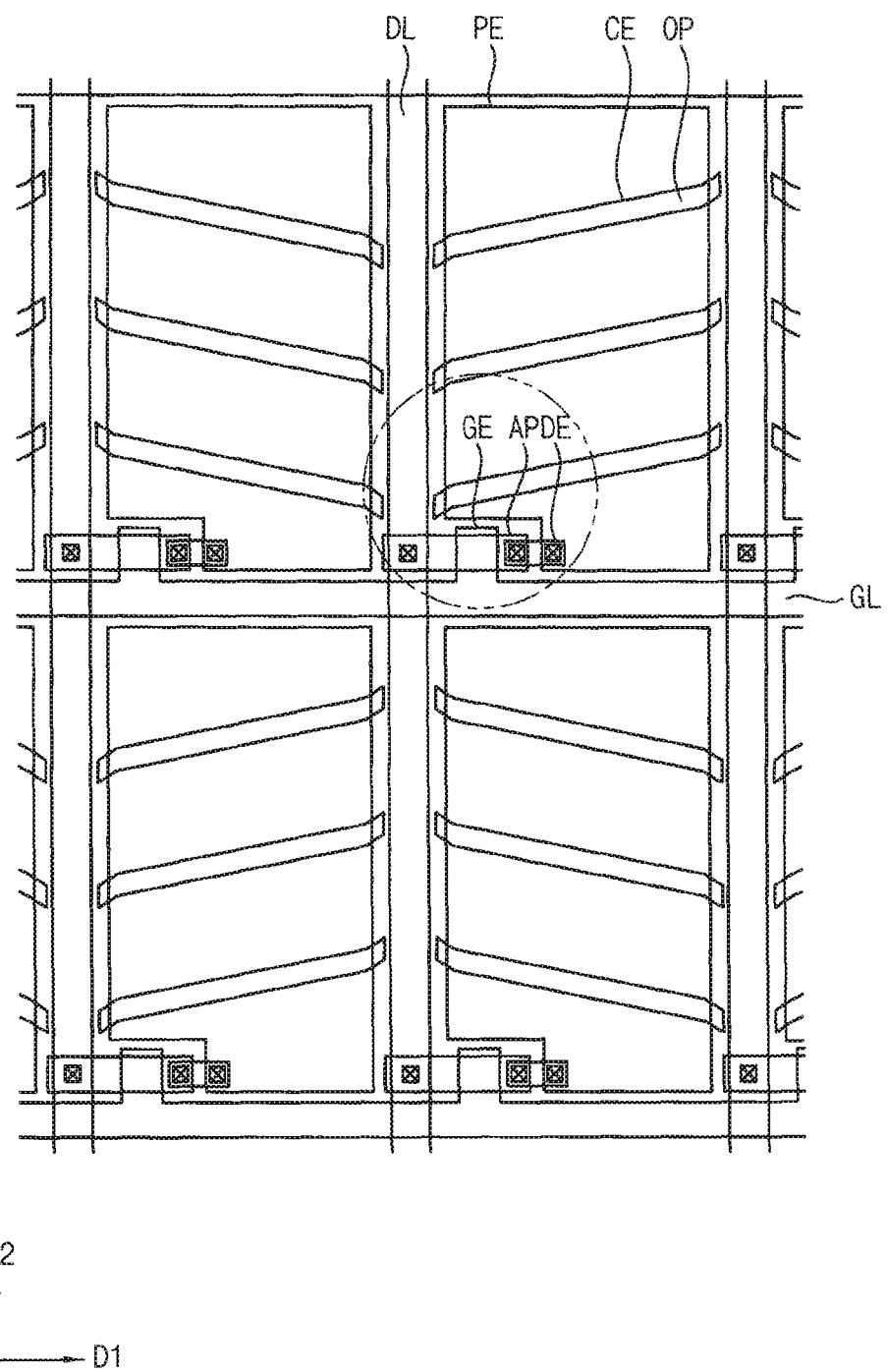
FIG. 18 is a plan view illustrating a display substrate according to another example embodiment of the present invention.
Figure 19:
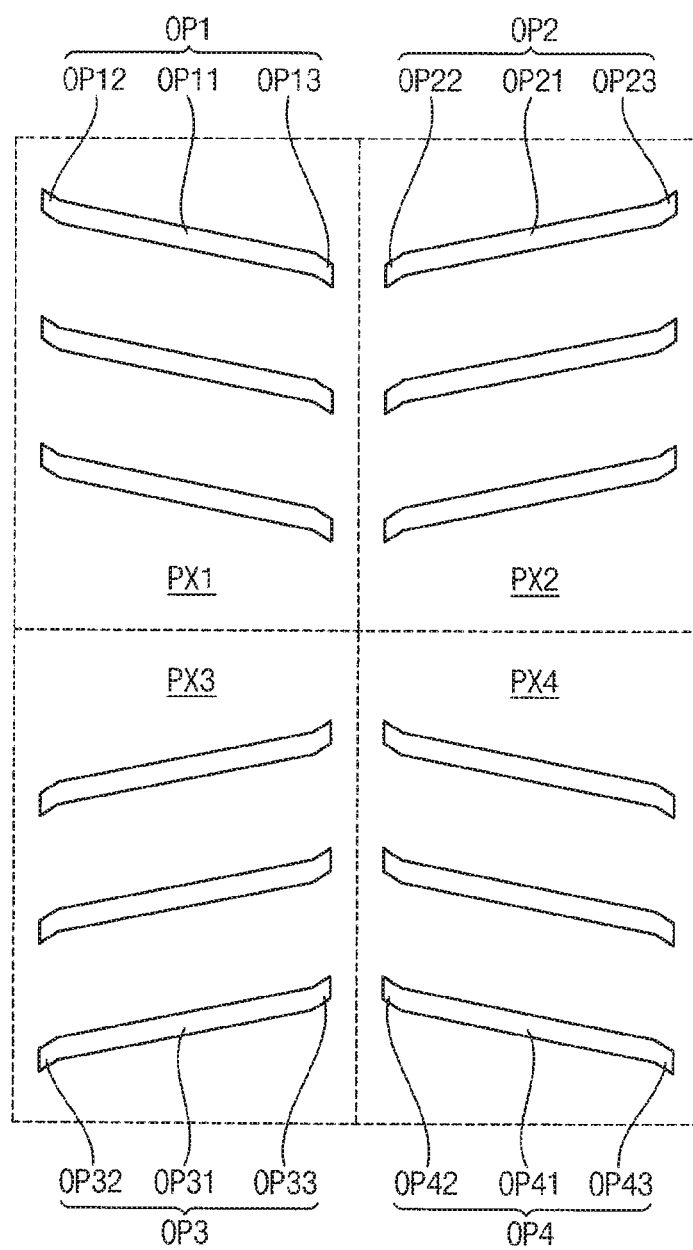
FIG. 19 is a plan view illustrating a common electrode of the display substrate of the embodiment illustrated in FIG. 18.

FIG. 18 is a plan view illustrating a display substrate according to another example embodiment of the present invention. FIG. 19 is a plan view illustrating a common electrode of the display substrate illustrated in FIG. 18.

Referring to FIG. 18, a display substrate includes a gate line GL, a data line DL, a gate electrode GE, a source electrode SE, a drain electrode DE, an active pattern AP, a pixel electrode PE, and a common electrode CE. The common electrode CCE has an opening OP overlapping with the pixel electrode PE.

The display substrate is substantially the same as the display substrate 100 of the embodiment illustrated in FIG. 2 (although a shape of the opening OP of the common electrode CE is different). Thus, duplicative explanation will be omitted.

Referring to FIGS. 18 and 19, a first opening OP1 in a first pixel area PX1 is separated from, and spaced apart from, a second opening OP2 in a second pixel area PX2 adjacent the first pixel area PX1 in a row direction D1. Thus, the common electrode CE continuously extends in a column direction D2. For example, the common electrode CE may overlap with an entirety of the data line DL. In an embodiment of the present invention, the first opening OP1 and the second opening OP2 are spaced apart from the data line DL in a plan view (e.g., the first opening OP1 and the second opening OP2 do not overlap the data line DL).

Particularly, the first opening OP1 in the first pixel area PX1 includes a first extending portion OP11 extending in a first direction, a second extending portion OP12 extending from an end of the first extending portion OP11 in a second direction, and a third extending portion OP13 extending from an opposite end of the first extending portion OP11 in a third direction. The first extending portion OP11, the second extending portion OP12, and the third extending portion OP13 are continuously coupled to each other.

In an embodiment of the present invention, the first direction is different from the second direction, and the second direction is substantially parallel to (e.g., opposite to) the third direction. The first direction is tilted to the row direction D1 such that the first direction is not parallel to either the gate line GL or the data line DL.

In an embodiment of the present invention, the first extending portion OP11 is entirely overlapped with the pixel electrode PE (e.g., the pixel electrode PE is below an entirety of the first extending portion OP11), and the second extending portion OP12 and the third extending portion OP13 are partially overlapped with the pixel electrode PE.

In an embodiment of the present invention, the first pixel area PX1 includes a plurality of first openings OP1 spaced apart from each other in the column direction D2.

A second opening OP2 in a second pixel area PX2 adjacent the first pixel area PX1 in a row direction D1 has a shape symmetrical to that of the first opening OP1 with respect to the data line DL.

In the present embodiment, the second opening OP2 includes a first extending portion OP21 extending in a fourth direction, a second extending portion OP22 extending from an end of the first extending portion OP21 in a fifth direction, and a third extending portion OP23 extending from an opposite end of the first extending portion OP21 in a sixth direction. The first extending portion OP21, the second extending portion OP22, and the third extending portion OP23 are continuously coupled to each other to form the second opening OP2.

In an embodiment of the present invention, the fourth direction is different from the fifth direction, and the fifth direction is substantially parallel to (e.g., opposite to) the sixth direction. The fourth direction is tilted to the row direction D1 such that the fourth direction is not parallel to either the gate line GL or the data line DL.

A third opening OP3 in a third pixel area PX3 adjacent the first pixel area PX1 in the column direction D2 has a shape symmetrical to that of the first opening OP1 with respect to the gate line GL. Thus, the third opening OP3 has a substantially similar shape as that of the second opening OP2. Particularly, the third opening OP3 includes a first extending portion OP31, a second extending portion OP32, and a third extending portion OP33, which are continuously coupled to each other.

A fourth opening OP4 in a fourth pixel area PX4 adjacent the second pixel area PX2 in the column direction D2 and adjacent the third pixel area PX3 in the row direction D1 has a shape symmetrical to the second opening OP2 with respect to the gate line GL. Furthermore, the fourth opening OP4 has a shape symmetrical to that of the third opening OP3 with respect to the data line DL. Thus, the fourth opening OP4 has substantially a same shape as that of the first opening OP1. Particularly, the fourth opening OP4 includes a first extending portion OP41, a second extending portion OP42, and a third extending portion OP43, which are continuously coupled to each other.

Thus, the common electrode CE in an embodiment of the present invention has a repeating unit including four pixel areas corresponding to two rows and two columns. First to fourth pixels respectively corresponding to the first to fourth pixel areas PX1, PX2, PX3 and PX4 are coupled to different thin film transistors to be independently driven.

Figure 20:
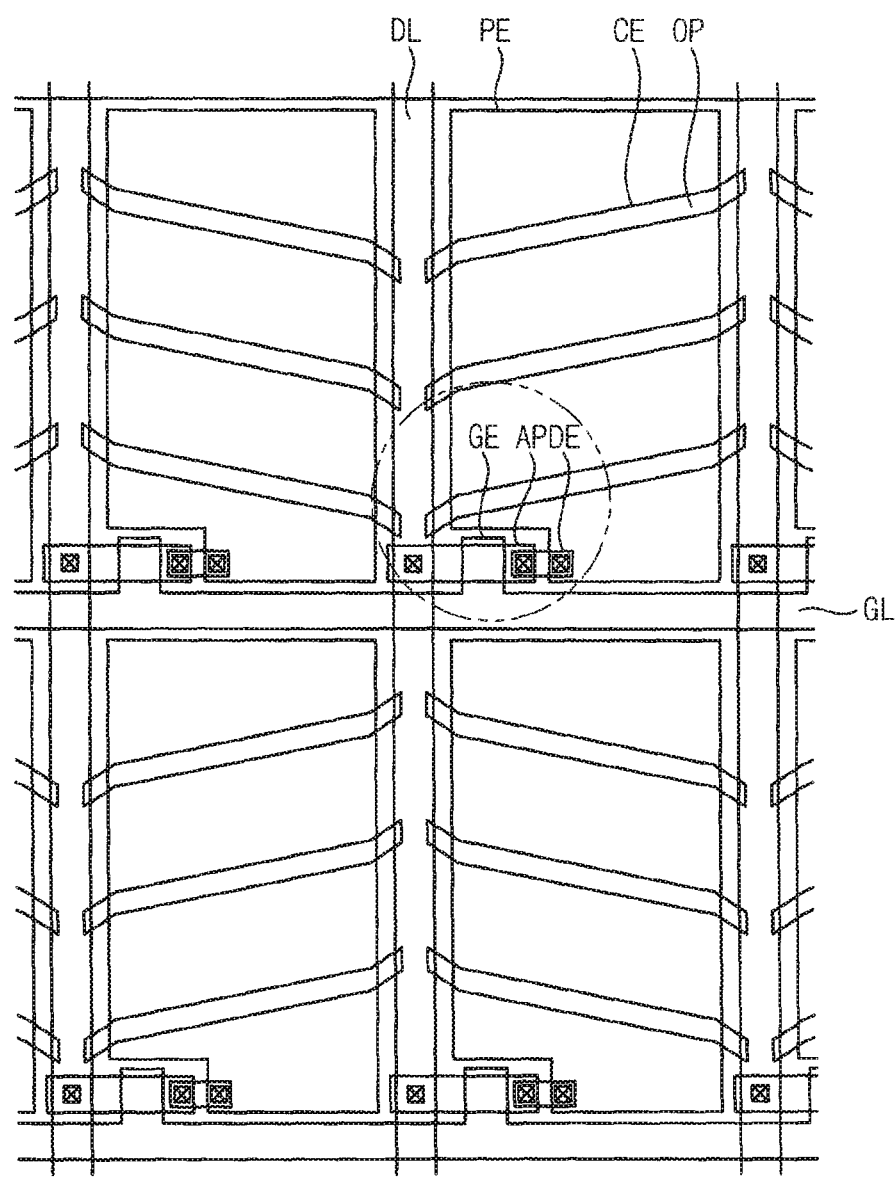
FIG. 20 is a plan view illustrating a display substrate according to another embodiment of the present invention.

FIG. 20 is a plan view illustrating a display substrate according to another embodiment of the present invention. Referring to FIG. 20, a display substrate includes a gate line GL, a data line DL, gate electrode GE, a source electrode SE, a drain electrode DE, an active pattern AP, a pixel electrode PE, and a common electrode CE. The common electrode CE has an opening OP overlapping the pixel electrode PE.

The display substrate of the present embodiment is substantially the same as the display substrate 100 of the embodiment illustrated in FIG. 18 (although a shape of the opening OP of the common electrode CE is different). Thus, duplicative explanation will be omitted.

Referring to FIG. 20, the common electrode CE has a plurality of openings OP spaced apart from each other in a row direction D1. The opening OP partially overlaps with the data line DL. Thus, the common electrode CE overlaps a portion of the data line DL.

A display substrate, a liquid crystal display panel, and a method of manufacturing a display substrate according to example embodiments of the present invention may be used for a display device such as a monitor, a television, a screen of a mobile phone or the like.

The foregoing is illustrative of example embodiments of the present invention, and is not to be construed as limiting of the present invention. Although a few example embodiments have been described, those skilled in the art will readily appreciate that many modifications are possible in the example embodiments without materially departing from the novel aspects of the present invention. Accordingly, all such modifications are intended to be included within the scope of example embodiments as defined by the claims, and their equivalents. In the claims, means-plus-function clauses are intended to cover the structures described herein as performing the recited function, and not only structural equivalents but also equivalent structures. Therefore, it is to be understood that the foregoing is not to be construed as limited to the specific embodiments disclosed, and that modifications to the disclosed example embodiments, as well as other example embodiments, are intended to be included within the scope of the appended claims. Embodiments of the present invention are defined by the following claims, with equivalents of the claims to be included therein.

What is claimed is:

1. A display substrate comprising:
    a display area corresponding to a plurality of pixels;
    a peripheral area surrounding the display area;
    a thin film transistor for driving a corresponding one of the pixels;
    a gate line electrically coupled to the thin film transistor;
    a data line crossing the gate line and electrically coupled to the thin film transistor;
    a pixel electrode electrically coupled to the thin film transistor; and
    a common electrode overlapping the pixel electrode and having a first opening overlapping a first pixel of the pixels, and a second opening overlapping a second pixel of the pixels adjacent the first pixel,
    wherein the first opening and the second opening extend in different directions and are spaced apart from each other in a row direction and are mirror symmetrical to each other with respect to the data line, and
    wherein the common electrode is continuous and overlaps the first and second pixels,
    wherein the first opening includes:
    a first extending portion extending in a first direction;
    a second extending portion extending from an end of the first extending portion in a second direction different from the first direction; and
    a third extending portion extending from an opposite end of the first extending portion in a third direction different from the first direction.

2. The display substrate of claim 1, wherein the common electrode further has:
a third opening overlapping a third pixel of the pixels that is adjacent the first pixel in a column direction; and
a fourth opening overlapping a fourth pixel of the pixels that is adjacent the second pixel in the column direction and is adjacent the third pixel in the row direction,
wherein the third opening is symmetrical to the first opening with respect to the gate line, and
wherein the fourth opening is symmetrical to the second opening with respect to the gate line.

3. The display substrate of claim 2, wherein the second direction is opposite to the third direction.

4. The display substrate of claim 1, wherein the second extending portion and the third extending portion respectively overlap an adjacent data line.

5. The display substrate of claim 1, wherein the second extending portion and the third extending portion are spaced apart from an adjacent data line in a plan view.

6. The display substrate of claim 1, further comprising a common line electrically coupled to the common electrode at the peripheral area.

7. The display substrate of claim 1, wherein the common electrode is on the pixel electrode.

8. The display substrate of claim 1, further comprising a lower alignment layer on the common electrode and rubbed in a row direction.

9. A liquid crystal display panel comprising:
a display substrate comprising a display area corresponding to a plurality of pixels, and a peripheral area surrounding the display area;
an opposing substrate coupled to the display substrate;
a liquid crystal layer between the display substrate and the opposing substrate,
a thin film transistor on the display substrate and for driving a corresponding one of the pixels;
a gate line electrically coupled to the thin film transistor;
a data line crossing the gate line and electrically coupled to the thin film transistor;
a pixel electrode electrically coupled to the thin film transistor; and
a common electrode overlapping the pixel electrode and having a first opening overlapping a first pixel of the pixels, and a second opening overlapping a second pixel of the pixels adjacent the first pixel,
wherein the first opening and the second opening extend in different directions and are spaced apart from each other in a row direction and are mirror symmetrical to each other with respect to the data line, and
wherein the common electrode is continuous and overlaps the first and second pixels,
wherein the first opening includes:
a first extending portion extending in a first direction;
a second extending portion extending from an end of the first extending portion in a second direction different from the first direction; and
a third extending portion extending from an opposite end of the first extending portion in a third direction different from the first direction.

10. The liquid crystal display panel of claim 9, wherein the common electrode further has:
a third opening overlapping a third pixel of the pixels adjacent the first pixel in a column direction; and
a fourth opening overlapping a fourth pixel of the pixels adjacent the second pixel in the column direction and adjacent the third pixel in the row direction,
wherein the third opening is symmetrical to the first opening with respect to the gate line, and
wherein the fourth opening is symmetrical to the second opening with respect to the gate line.

11. The liquid crystal display panel of claim 9, wherein the second direction is opposite to the third direction.

12. The liquid crystal display panel of claim 9, wherein the second extending portion and the third extending portion each partially overlap the pixel electrode.

13. The liquid crystal display panel of claim 9, wherein the second extending portion and the third extending portion respectively overlap an adjacent data line.

14. The liquid crystal display panel of claim 9, wherein the second extending portion and the third extending portion are spaced apart from an adjacent data line in a plan view.

15. The liquid crystal display panel of claim 9, wherein the display substrate further comprises a common line electrically coupled to the common electrode at the peripheral area.

16. The liquid crystal display panel of claim 9, wherein the display substrate further comprises a lower alignment layer on the common electrode and rubbed in a row direction, and an upper alignment layer below the opposing substrate and rubbed in a row direction.

17. A display substrate comprising:
a plurality of pixel electrodes spaced apart from each other, each of the pixel electrodes being electrically connected to a thin film transistor electrically connected to a gate line and a date line;
a common electrode having a first opening overlapping a first pixel electrode, and a second opening overlapping a second pixel electrode adjacent to the first pixel electrode in a row direction,
wherein the first opening and the second opening extend in different directions and are spaced apart from each other in the row direction and are mirror symmetrical to each other with respect to a data line disposed between the first opening and the second opening, and
wherein the common electrode is continuous and overlaps the first and second pixel electrodes,
wherein the first opening includes:
a first extending portion extending in a first direction;
a second extending portion extending from an end of the first extending portion in a second direction different from the first direction; and
a third extending portion extending from an opposite end of the first extending portion in a third direction different from the first direction.

18. The display substrate of claim 17, wherein the common electrode further has:
a third opening overlapping a third pixel electrode adjacent the first pixel electrode in a column direction; and
a fourth opening overlapping a fourth pixel electrode adjacent the second pixel electrode in the column direction and adjacent the third pixel electrode in the row direction,
wherein the third opening is symmetrical to the first opening with respect to a gate line disposed between the third opening and the fourth opening, and
wherein the fourth opening is symmetrical to the second opening with respect to the gate line disposed between the third opening and the fourth opening.

19. The display substrate of claim 17, wherein the second direction is opposite to the third direction.

20. The display substrate of claim 17, wherein the second extending portion and the third extending portion are spaced apart from an adjacent data line in a plan view.

* * * * *